US012696597B2

(12) United States Patent
Kim et al.

(10) Patent No.: US 12,696,597 B2
(45) Date of Patent: Jul. 28, 2026

(54) PIXEL OF MICRODISPLAY HAVING INTEGRATED CATADIOPTRIC LIGHT EXTRACTION SYSTEM

(71) Applicant: SUNDIODE KOREA, Seoul (KR)

(72) Inventors: James Chinmo Kim, Mountain View, CA (US); Sungsoo Yi, Sunnyvale, CA (US)

(73) Assignee: SUNDIODE KOREA (KR)

( * ) Notice: Subject to any disclaimer, the term of this patent is extended or adjusted under 35 U.S.C. 154(b) by 906 days.

(21) Appl. No.: 17/970,562

(22) Filed: Oct. 20, 2022

(65) Prior Publication Data

US 2023/0420623 A1 Dec. 28, 2023

(30) Foreign Application Priority Data

Jun. 27, 2022 (KR) ........................ 10-2022-0077948

(51) Int. Cl.
 *H10H 20/856* (2025.01)
 *H10H 20/825* (2025.01)
(52) U.S. Cl.
 CPC ........ *H10H 20/856* (2025.01); *H10H 20/825* (2025.01)
(58) Field of Classification Search
 CPC .. H10H 20/856; H10H 20/825; H10H 20/841; H10H 20/819; H10H 20/813; H10H 20/814; H10H 29/142

USPC .......................................................... 257/79
See application file for complete search history.

(56) References Cited

U.S. PATENT DOCUMENTS

| | | | | |
|---|---|---|---|---|
| 9,923,032 | B2 * | 3/2018 | Lee ........................ | H10K 59/38 |
| 11,430,929 | B2 * | 8/2022 | Jang .................... | H10H 20/857 |
| 2007/0279941 | A1 * | 12/2007 | Koshio ................. | G02B 6/009 |
| | | | | 362/623 |
| 2009/0078955 | A1 * | 3/2009 | Fan ........................ | H10H 29/10 |
| | | | | 438/46 |
| 2012/0287958 | A1 * | 11/2012 | Lell ....................... | H01S 5/4043 |
| | | | | 372/45.01 |
| 2018/0174506 | A1 * | 6/2018 | Kim ....................... | H10H 20/80 |
| 2019/0258000 | A1 * | 8/2019 | El-Ghoroury ........ | G02B 6/0056 |
| 2020/0373284 | A1 * | 11/2020 | Jang ...................... | H10H 29/39 |
| 2021/0104870 | A1 * | 4/2021 | Sato .................... | H01S 5/18377 |
| 2022/0123171 | A1 * | 4/2022 | Kanaya .............. | H01L 25/0753 |

* cited by examiner

*Primary Examiner* — Caleb E Henry
*Assistant Examiner* — Pratiksha Jayant Lohakare
(74) *Attorney, Agent, or Firm* — Renaissance IP Law Group LLP

(57) ABSTRACT

Disclosed is a unit pixel of a microdisplay having a concave reflector with a center aperture. The light extractor has a protrusion and a bulk portion formed using the same epitaxial growth process. The concave reflector with a center aperture is formed on the protrusion, and epitaxial growth of the light-emitting body is made through the aperture concave reflector. In addition, the light rays reflected by the concave reflector with a center aperture has exit angles that are nearly perpendicular to the exit surface and are thus easily emitted to the outside.

14 Claims, 8 Drawing Sheets

PIXEL OF MICRODISPLAY HAVING INTEGRATED CATADIOPTRIC LIGHT EXTRACTION SYSTEM

TECHNICAL FIELD

The present inventive display relates to a pixel structure of a microdisplay, and more specifically, to a pixel of a microdisplay having a reflector based on internal total reflection on an upper portion of a light emitting body.

BACKGROUND ART

A microdisplay is a display device in which light-emitting diodes (LEDs) are fabricated into units of several micrometers or several tens of micrometers in size and the fabricated LEDs are assembled onto a substrate. The LEDs constituting each and every pixel are formed using an epitaxial growth technique and has high color purity suitable for realizing clear images. In addition, the pixels of the microdisplay which are made of inorganic semiconductor materials have superior reliability compared to OLED pixels.

However, a conventional microdisplay requires a process in which unit pixels are singulated and then reassembled onto a substrate for display manufacturing. LEDs formed using an epitaxial growth process on a sapphire substrate are singulated into individual sub-pixels for reassembling and bonded to a substrate through a transfer process. The transfer process is a process of picking and placing micro-sized pixels and is known to be a very laborious process.

In order to address the above problems, the inventors of the present inventive concept have proposed a pixel structure of a microdisplay having a vertical stacking structure. The vertically stacked structure is a structure in which blue, green, and red LEDs are vertically stacked through an epitaxial growth process or a bonding process, and thus sub-pixels are vertically arranged in a pixel. Thus, the stacked-RGB pixel technology substantially or even entirely removes the requirement for laborious pixel-transfer process.

In the above-described vertical stacking structure, the light-emitting surface has a planar structure. However, when light is emitted through the plane, the range of emission angles of the light emitted from the display is characteristically broad. In particular, a microdisplay used in augmented/virtual-reality glasses requires a very narrow range of light emission angles for coupling with waveguide optical components. Also, there is another problem in that excessive power is consumed to implement a clear image.

In order to solve the above problem, a technology for introducing a concave reflector based on total internal reflection into a LED is introduced. In the Japanese Patent No. 6230038, a lens is introduced into an UV (ultraviolet)-LED to improve light extraction efficiency. Referring to FIG. 2A of the Japanese patent, a sapphire lens is formed on a sapphire substrate. The sapphire lens is bonded to the back surface of the substrate. Adhesive or surface-activated bonding may be used for bonding. That is, a light-emitting body on a substrate is formed through an epitaxial growth process, and a lens is bonded on the back surface of the substrate opposite to the surface on which the light-emitting body is formed.

When the above method in the Japanese patent is used, the light extraction efficiency is reduced due to the adhesive at the interface between the substrate and the lens, and there is a problem in that the lens may become separated by the external environment and heat generated from the light-emitting body. In addition, since the refractive index of sapphire is 1.77, the amount of light emitted in a direction perpendicular to the surface of the light emitting body is insufficient.

DISCLOSURE

Technical Problem

A technical objective of the present inventive concept is to provide a unit pixel of a microdisplay with light beams that are highly forward-directed, that is, improved intensity of light emitted in a direction perpendicular to the light-exiting surface.

Technical Solution

The present inventive concept for achieving the above-described technical objective provides a pixel of a microdisplay comprising: a light extractor having a compound semiconductor and having a hemispherical protrusion and a bulk portion having the same material as the protrusion; a reflector with a center aperture formed on a surface of the protrusion; and a light emitting body formed on the reflector with a center aperture and light-emitting crystalline material grown on top of the light extractor to form light of a specific wavelength.

The technical object of the present inventive concept is achieved by providing a pixel of a microdisplay comprising: a light extractor having a hemispherical protrusion made of a GaN material and a bulk portion having the same material as the protrusion; a reflector with a center aperture formed on a surface of the protrusion; and a light-emitting body for forming blue light, green light and red light.

Advantageous Effects

According to the present inventive concept, the base material for growing the semiconductor layer performing the light-emitting operation is not a substrate, but a light extractor. The light extractor is composed of a hemispherical protrusion protruding in a direction opposite to the direction in which light is emitted and a bulk portion, and serves as a base material for the growth of a light emitting body composed of a single crystal material. The light extractor has a material of n-GaN, and a concave reflector with a center aperture is formed on the protrusion. The concave reflector with a center aperture reflects the light formed in the active layers, and forms light with a small exit angle through the light extractor. So, a unit pixel of a microdisplay with improved amount of forward-directed light is formed.

DETAILED DESCRIPTION

Figure 1:
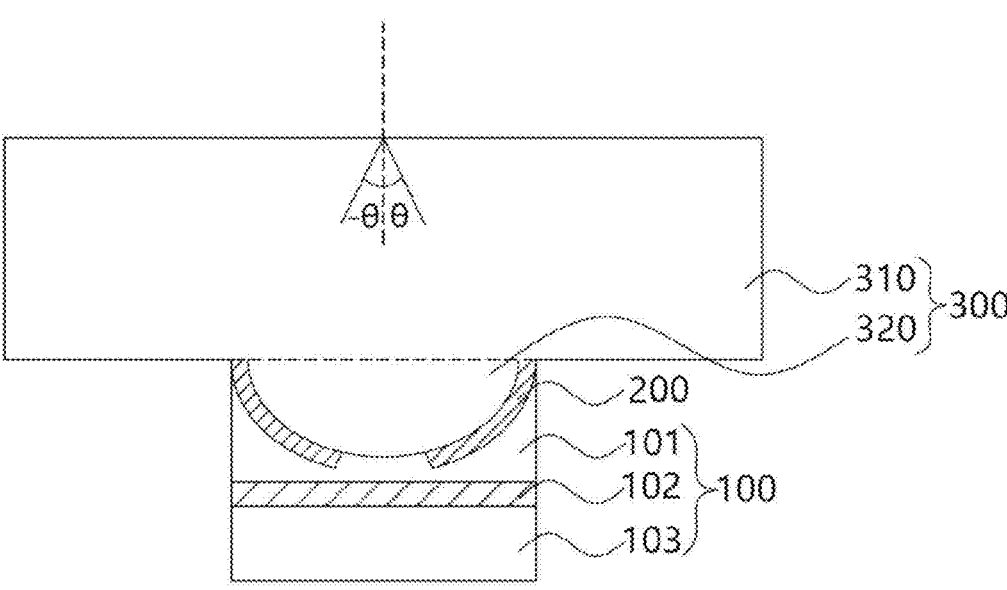
FIG. 1 is a cross-sectional view showing a pixel of microdisplay according to first embodiment of the present inventive concept.

Since the present inventive concept may be variously changed and have various forms, specific embodiments will be exemplified in the drawings and described in detail in the text. However, it should be understood that this does not limit the present inventive concept to a specific disclosure, and includes all modifications, equivalents and substitutes included in the spirit and the scope of the present inventive concept. In a description of each drawing, similar reference numerals are used for similar elements.

Unless otherwise defined, all terms used herein, including technical or scientific terms, have the same meaning as generally understood by those skilled in the art. Terms such as terms defined in generally used dictionaries should be interpreted as having meanings consistent with the meanings in the context of the related art and should not be interpreted in an idealistic or excessively formal sense unless otherwise defined in the present application.

Hereinafter, exemplary embodiments of the present inventive concept will be described in more detail with reference to the accompanying drawings.

First Embodiment

FIG. 1 is a cross-sectional view showing a pixel of a microdisplay according to first embodiment of the present inventive concept.

Referring to FIG. 1, a unit pixel of a microdisplay has a light-emitting body 100, a concave reflector 200 with a center aperture formed in contact with the light emitting body 101, and a light extractor 300.

The light-emitting body 100 generates light of a specific wavelength and has an n-type semiconductor layer 101, an active layer 102 and a p-type semiconductor layer 103. The active layer 102 preferably has a multi-quantum-well structure, and electrons supplied from the n-type semiconductor layer 101 and holes supplied from the p-type semiconductor layer 103 combine in the active layer 102 to generate light of a specific wavelength.

In particular, the light-emitting body 100 may be composed of a GaN-based semiconductor and may form light in a wavelength corresponding to visible light. The wavelength of the formed light is determined by the bandgap of the well layers in the active layer 102. In addition, the light-emitting body 100 may be composed of an AlN or AlGaN-based semiconductor, through which the light-emitting body 100 can generate UV light.

In particular, the n-type semiconductor layer 101 has a hemispherical shape that is concave toward the light extractor 300.

The concave reflector 200 with a center aperture has a hemispherical shape with an open center and is formed on the n-type semiconductor layer 101. The concave reflector 200 with a center aperture is preferably made of $SiO_2$ or $Al_2O_3$. In particular, the concave reflector 200 with a center aperture preferably has a refractive index that is greater than that of air and smaller than that of the n-type semiconductor layer 101.

A surface of the concave reflector 200 with a center aperture in contact with the protrusion 320 of the light extractor 300 is defined as an inner surface, and a surface of the concave reflector 200 with a center aperture in contact with the n-type semiconductor layer 101 is defined as an outer surface. Light from the n-type semiconductor layer 101 propagating toward the concave reflector 200 with a center aperture with an angle that is beyond the critical angle may be reflected from the outer surface and may pass through the opening of the concave reflector 200 with a center aperture to reflect at the inner surface to preferentially proceed in a direction that is perpendicular or nearly perpendicular to the surface of the light extraction unit 300.

In addition, the central portion of the concave reflector 200 with a center aperture is open. Accordingly, the n-type semiconductor layer 101 and the light extractor 300 are physically connected through the opening. In particular, the n-type semiconductor layer 101 and the light extractor 300 are made of the same material and have the same composition. Accordingly, when the active layer 102 forms blue light, the light extractor 300 is composed of n-GaN, and when the active layer 102 forms UV (ultraviolet) light, the light extractor 300 is composed of n-AlGaN. For example, the n-type semiconductor layer 101 needs to be understood as layer formed using epitaxial growth through the opening of the concave reflector 200 with a center aperture.

The light generated in the active layer 102 under the concave reflector 200 with a center aperture has a strong intensity at a specific angular range. Here, when the light formed in the light-emitting body 100 passes through the opening of a concave reflector 200 with a center aperture and heads toward the outside through the light extractor 300, the exit angle θ may be defined. The exit angle θ refers to an angle formed by the emitted light with respect to a line that is perpendicular to the outer surface of the light extractor 300. When the exit angle θ is formed within a specific range, the intensity of emitted light greatly increases.

In addition, when the light formed on the surface of the active layer 102 has an exit angle θ smaller than the critical angle, the light enters the light extractor 300 through the opening of the concave reflector 200 with a center aperture and exits to outside. On the other hand, the light formed with an exit angle θ greater than the critical angle is reflected from the outer surface of the concave reflector 200 with a center aperture, or is reflected from the inner surface of the concave reflector 200 with a center aperture, so that the light exits to the outside through the light extractor 300 by forming a low exit angle θ.

A light extractor 300 is formed on the concave reflector 200 with a center aperture and the n-type semiconductor layer 101 through the opening of the concave reflector 200 with a center aperture. The light extractor 300 has the same material with the n-type semiconductor layer 101 and is preferably doped with an n-type dopant. The light extractor 300 has a bulk portion 310 and a protrusion 320. The bulk portion 310 and the protrusion 320 are formed through the same epitaxial growth process, but their shapes are distinguished from each other through various methods such as etching.

The light extractor 300 serves as a base material for forming the concave reflector 200 with a center aperture and the light emitting body 100.

Figure 2:
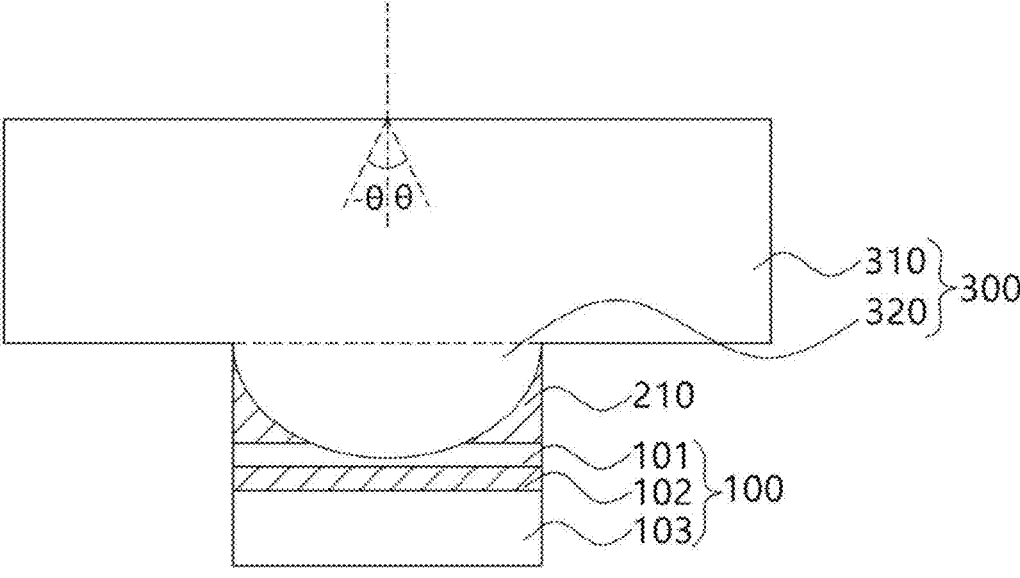
FIG. 2 is another cross-sectional view illustrating a pixel of a microdisplay according to the first embodiment of the present inventive concept.

FIG. 2 is another cross-sectional view illustrating a pixel of a microdisplay according to the first embodiment of the present inventive concept.

Referring to FIG. 2, a unit pixel of a microdisplay includes a light-emitting body 100, a concave reflector 210 with a center aperture formed in contact with the light emitting body 100, and a light extractor 300.

The light emitting body 100 is the same as described in FIG. 1, and the light-emitting body 100 forms visible light or UV light.

Also, the material and shape of the light extractor 300 are the same as those shown in FIG. 1. Accordingly, the light extractor 300 has n-GaN or n-AlGaN, and has a bulk portion 310 and a protrusion 320. Most of the surface of the bulk portion 310 is exposed, the central portion of the protrusion 320 is also open, and a concave reflector 210 with a center aperture is formed on the side surface of the protrusion 320. While the concave reflector 210 with a center aperture in FIG. 1 has a constant thickness, in FIG. 2, the concave reflector 210 with a center aperture has shape which fills the space between the n-type semiconductor layer 101 having a flat shape and the hemispherical protrusion 320.

Second Embodiment

Figure 3:
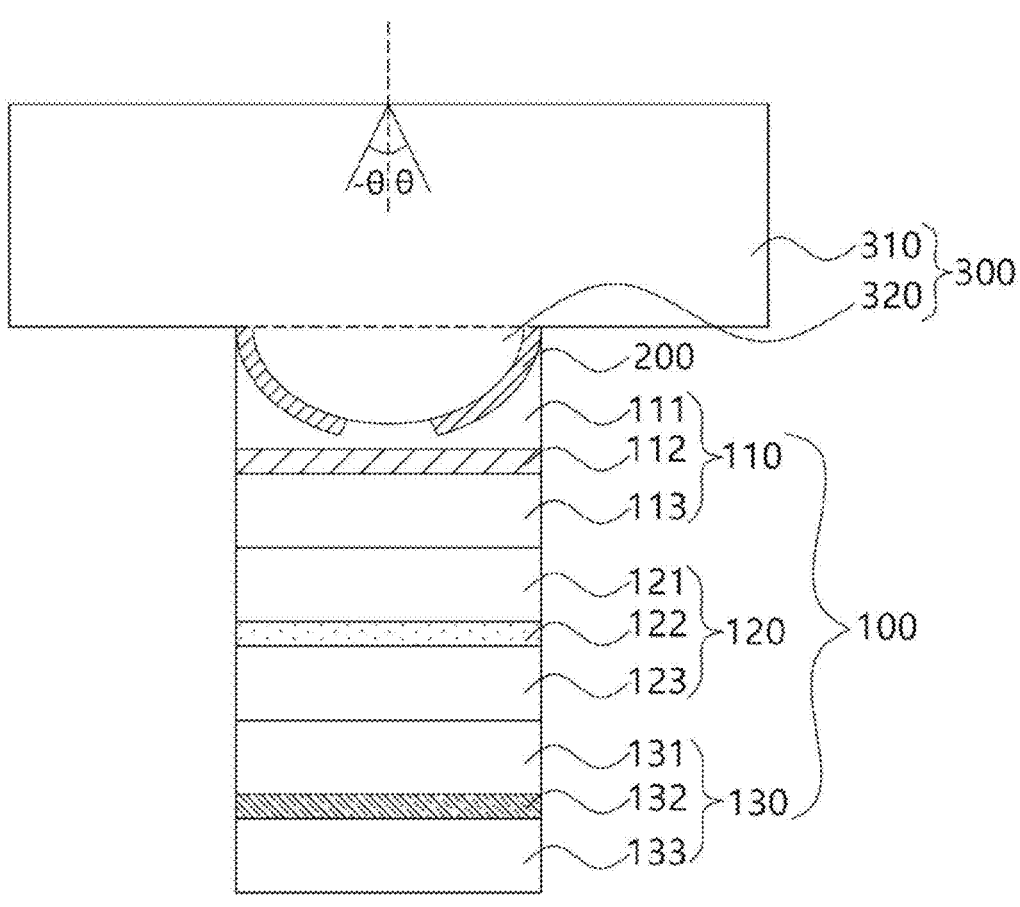
FIG. 3 is a cross-sectional view illustrating a pixel of a microdisplay according to a second embodiment of the present inventive concept.

FIG. 3 is a cross-sectional view illustrating a pixel of a microdisplay according to a second embodiment of the present inventive concept.

Referring to FIG. 3, a unit pixel of a microdisplay includes a light-emitting body 100, a concave reflector 200 with a center aperture formed in contact with the light emitting body 100, and a light extractor 300.

Except that the light-emitting body 100 in FIG. 3 has two or more light emitting diodes vertically stacked, the configuration and shape of the concave reflector 200 with a center aperture and the light extractor 300 are the same as described in FIG. 1.

The light-emitting body 100 includes a first light emitting diode 110, a second light-emitting diode 120, and a third light-emitting diode 130 on the concave reflector 200 with a center aperture.

The first light-emitting diode 110 forms light of a first wavelength and includes a first n-type semiconductor layer 111, a first active layer 112, and a first p-type semiconductor layer 113. The second light-emitting diode 120 forms light of a second wavelength longer than the first wavelength and has a second p-type semiconductor layer 121, a second active layer 122, and a second n-type semiconductor layer 123. The third light-emitting diode 130 forms light of a third wavelength having a longer wavelength than the light of the second wavelength and includes a third n-type semiconductor layer 131, a third active layer 132, a third p-type semiconductor a layer 133.

Each of the light-emitting diodes 110, 120, and 130 has an n-type semiconductor layer, a p-type semiconductor layer, and an active layer disposed between the semiconductor layers. Electrons supplied from the n-type semiconductor layer and holes supplied from the p-type semiconductor layer recombine in the active layer to perform a light-emitting operation. The active layers of each of the light emitting diodes 110, 120 and 130 have a multi-quantum-well structure, and the emission wavelength is determined by the band gap of the well layers.

For example, the first active layer 112 generates blue light, and the second active layer 122 generates green light. In addition, the third active layer 132 generates red light.

In particular, the first light-emitting diode 110 has a GaN material and has the first n-type semiconductor layer, the first active layer 112, and the first p-type semiconductor layer 113. In particular, the first semiconductor layer 111 has a hemispherical shape that is concave toward the light extractor 300.

The concave reflector 200 with a center aperture has the same material and shape as described with reference to FIG. 1. Accordingly, the inner surface in contact with the first n-type semiconductor layer has an opening formed at the center toward the protrusion and has a concave hemispherical shape. In addition, the concave reflector 200 with a center aperture is preferably made of $SiO_2$ or $Al_2O_3$. In particular, the concave reflector 200 with a center aperture preferably has a refractive index greater than that of air and less than that of GaN.

The light formed in the light-emitting body 100 passes through the opening in the concave reflector 200 with a center aperture and exits to the outside through the light extractor 300. When the exit angle θ is formed within a specific range, the intensity of emitted light is greatly increased.

In addition, when the light formed on the surface of the active layers 112, 122, 132 has an exit angle smaller than the critical angle, the light enters the light extractor 300 through the opening of the concave reflector 200 with a center aperture, and then extracted outward. On the other hand, the light formed with an exit angle greater than the critical angle is either reflected from the lower surface of the apertured concave reflector 200 or is reflected from the upper surface of the concave reflector 200 with a center aperture so that a low exit angle θ may be formed and the light exits to the outside through the light extraction unit 300.

The light extractor 300 is formed on the concave reflector 200 with a center aperture and the first n-type semiconductor layer 111 exposed through the opening of the concave reflector 200 with a center aperture. The light extractor 300 is preferably made of n-GaN. The light extractor 300 has a bulk portion 310 and a protrusion 320, and the light extractor 300 serves as a base material for forming the light emitting body 100.

Simulation Example 1

The amount of light that is within a 15° exit angle and exiting from the unit pixel of the microdisplay illustrated in FIG. 3 is measured through a simulation. The simulation conditions are as follows.

In FIG. 3, the thickness of the bulk portion is 6 μm, the width of the hemispherical protrusion is 3 μm, and the height of the protrusion is defined as the length from an imaginary straight line connecting the bulk portion to the top of the hemispherical protrusion and is 1.8 μm. In addition, the distance from the interface where the protrusion is in contact with the bulk portion to the first active layer is 2 μm. Accordingly, the smallest thickness of the first n-type semiconductor layer is 0.2 μm. The distance between the first active layer and the second active layer is 1.1 μm, and the distance between the second active layer and the third active layer is 1.7 μm.

In particular, the concave reflector with a center aperture is made of $SiO_2$, and the thickness is varied. Further, the dimension of the opening in the central region of the concave reflector with a center aperture is set to half of the dimension of the horizontal extent of the concave reflector with a center aperture. That is, the circularly opened area from the uppermost vertex is configured to have a dimension that is half of that of the horizontal extent of the concave reflector with a center aperture. That is, the opening of the concave reflector with a center aperture is symmetric with respect to the central vertex.

Since the concave reflector with a center aperture is opened at the center, light rays passing through the opening and incident to the light extractor have small exit angles.

Figure 4A:
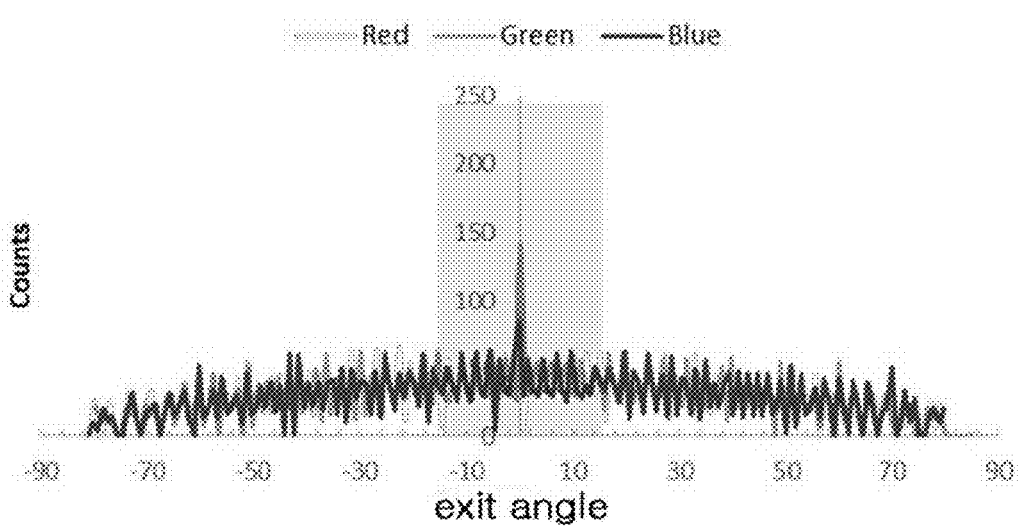
FIGS. 4A-4B are graphs comparing the amount of light depending on exit angle according to Simulation Example 1 of the present inventive concept.
Figure 4B:
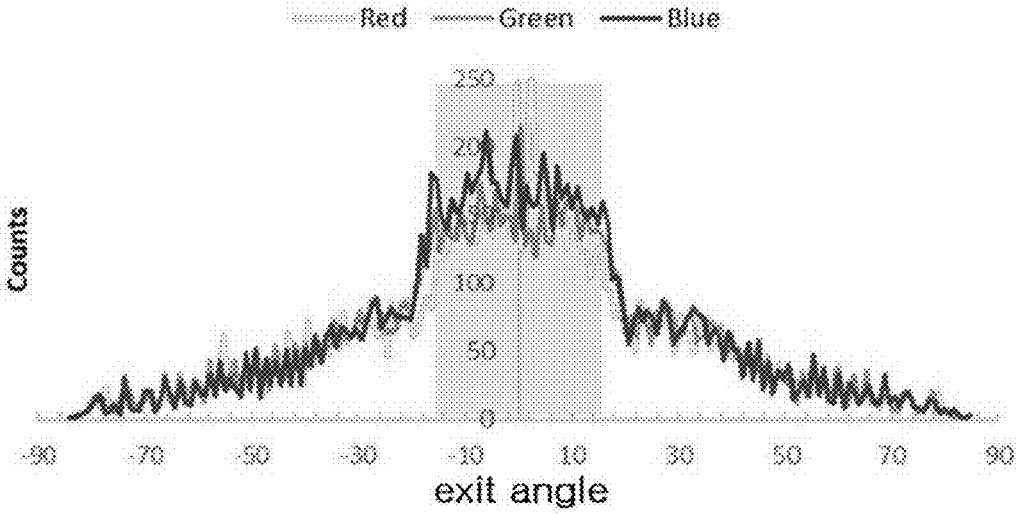

FIG. 4 is a graph comparing the amount of light depending on the exit angle according to Simulation Example 1 of the present inventive concept.

Referring to FIG. 4, graph (a) shows a case in which there is no concave reflector with a center aperture, and graph (b) corresponds to a case in which a concave reflector with a center aperture is formed to a thickness of 0.86 μm. In the absence of the concave reflector with a center aperture, light having an exit angle between −80° and 80° is evenly distributed. However, when the concave reflector with a center aperture is formed, the intensity of light having an exit angle between −15° and 15° is greatly increased. Through this, it can be confirmed that, when a hemispherical and partially open concave reflector with a center aperture is used as described in the present inventive concept, the light formed at the light emitting body is greatly improved in terms of being forward-going, that is, light rays having exit angles within +15° of the vertical. In addition, the gain depending on the thickness of the concave reflector with a center aperture for each light source in graph (b) is summarized in Table 1 below.

TABLE 1

| Thickness of concave reflector with a center | Light intensity gain with respect to a reference value | | |
|---|---|---|---|
| aperture (um) | red | green | blue |
| 0.22 | 2.4 | 2.2 | 2.4 |
| 0.43 | 2.7 | 2.6 | 2.8 |
| 0.65 | 3.1 | 2.9 | 3.4 |
| 0.86 | 3.4 | 3.3 | 3.9 |

Referring to Table 1, the third active layer emits red light, the second active layer emits green light, and the first active layer emits blue light. In addition, the shape and dimensions of the pixel are the same as those described in FIG. 2, and the amount of light having an exit angle within ±15° is measured and compared with a reference value. The reference value of the amount of light is the amount of light having an exit angle within ±15° in the graph (a) of FIG. 4. The gain is a numerical value obtained by arithmetically dividing the measured light quantity within the ±15° exit angle by the reference value while changing the thickness of the concave reflector with a center aperture.

In Table 1, as the thickness of the concave reflector with a center aperture increases, the light intensity gain gradually increases. The inventors of the present inventive concept explain that the increase in the light intensity gain is due to an increase in the amount of light reflected from the surface of the concave reflector with a center aperture with increased thickness.

FIG. 5 to FIG. 10 are cross-sectional views for describing a method of manufacturing the pixel of the microdisplay of FIG. 3 according to the second embodiment of the present inventive concept.

Figure 5:
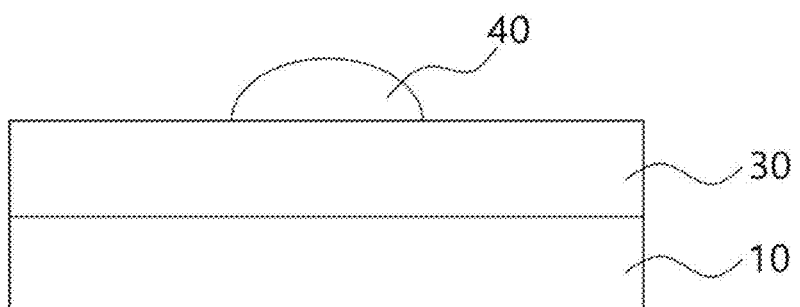
FIG. 5 to FIG. 10 are cross-sectional views for explaining a method of manufacturing the pixel of the microdisplay of FIG. 3 according to the second embodiment of the present inventive concept.

Referring to FIG. 5, a preliminary semiconductor layer 30 is formed on a substrate 10 using an epitaxial growth technique which produces a single crystal material. The formed preliminary semiconductor layer 30 preferably is n-GaN. A photoresist pattern is formed on the preliminary semiconductor layer 30, and the photoresist pattern is reflowed by heating and cooling with suitable temperatures. A first photoresist pattern 40 having a shape that is substantially hemispherical is formed by the reflow process.

Figure 6:
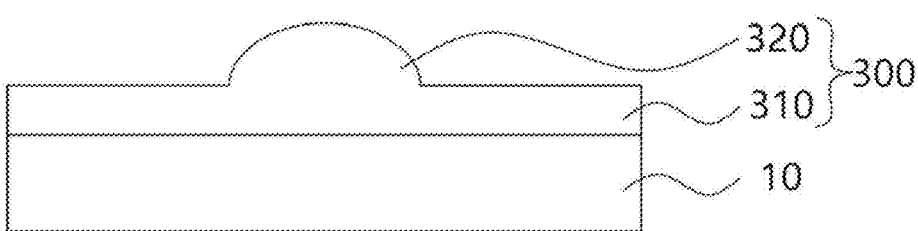

Referring to FIG. 6, the preliminary semiconductor layer is etched using the first photoresist pattern as an etch mask. The etching is preferably non-selective dry etching, and the hemispherical first photoresist pattern is gradually removed by the dry etching and the protrusion 320 of the preliminary semiconductor layer is formed replicating the profile of the first photoresist pattern. In addition, the preliminary semiconductor layer in the region where the first hemispherical photoresist pattern is not formed is uniformly etched to gradually reduce in thickness. Accordingly, the region in which the first hemispherical photoresist pattern is not formed is formed as the bulk portion 310, and the protrusion 320 of a hemispherical shape is formed replicating the hemispherical profile of the first photoresist pattern and protruding from the bulk portion, so that the light extractor 300 is formed.

Figure 7:
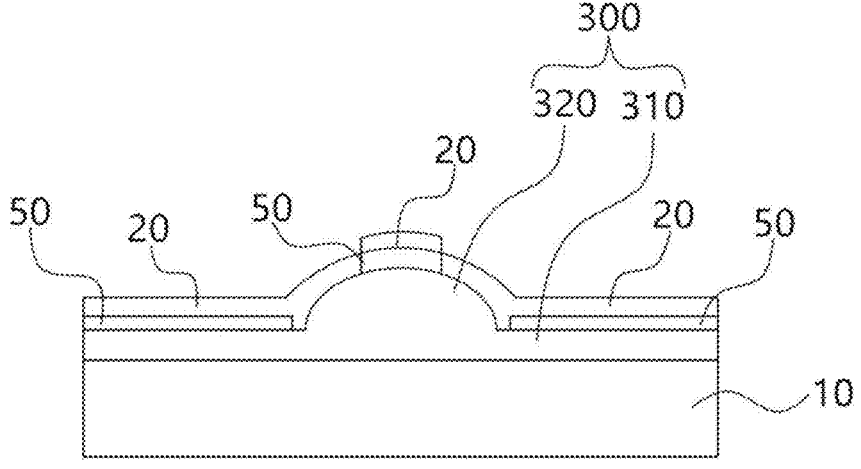

Referring to FIG. 7, a second photoresist pattern 50 is formed on the surface of the light extractor 300. The second photoresist pattern 50 opens a portion of the side of the hemispherical protrusion 320. Subsequently, $SiO_2$ or $Al_2O_3$ is deposited to form the reflector layer 20. The reflector layer 20 is formed on the upper surface of the second photoresist pattern 50 and the side of the open hemispherical protrusion 320.

Figure 8:
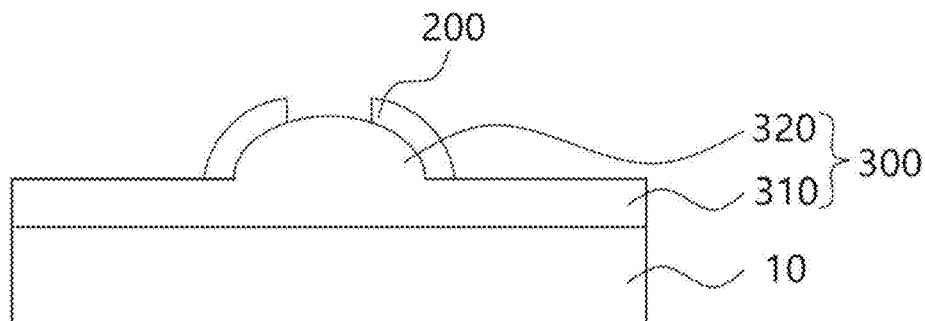

Referring to FIG. 8, a lift-off process is performed in which the formed second photoresist pattern is removed and the reflector layer formed on the side surface of the hemispherical protrusion 320 remains. That is, when the second photoresist pattern is removed, the reflector layer formed on the second photoresist pattern is also removed, and only the reflector layer in the region where the second photoresist pattern is not formed remains, thereby forming the concave reflector 200 with a center aperture. Accordingly, only the concave reflector 200 with a center aperture covering the side surface of the protrusion 320 remains. In addition, the upper center of the protrusion 320 is open.

Figure 9:
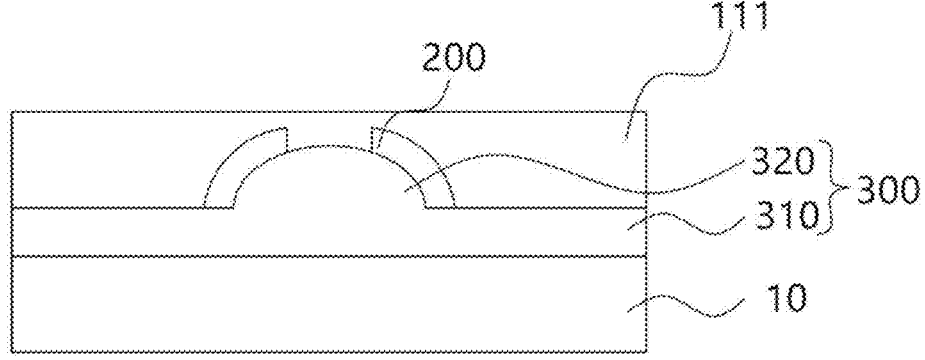

Referring to FIG. 9, a planarization layer is formed using the open surface of the bulk portion 310 and the protrusion 320 of the n-GaN material exposed through the opening of the concave reflector 200 with a center aperture as the base material for growth. The planarization layer may be the first n-type semiconductor layer 111. Like the light extractor 300, Si is used as a dopant for the first n-type semiconductor layer 111.

Figure 10:
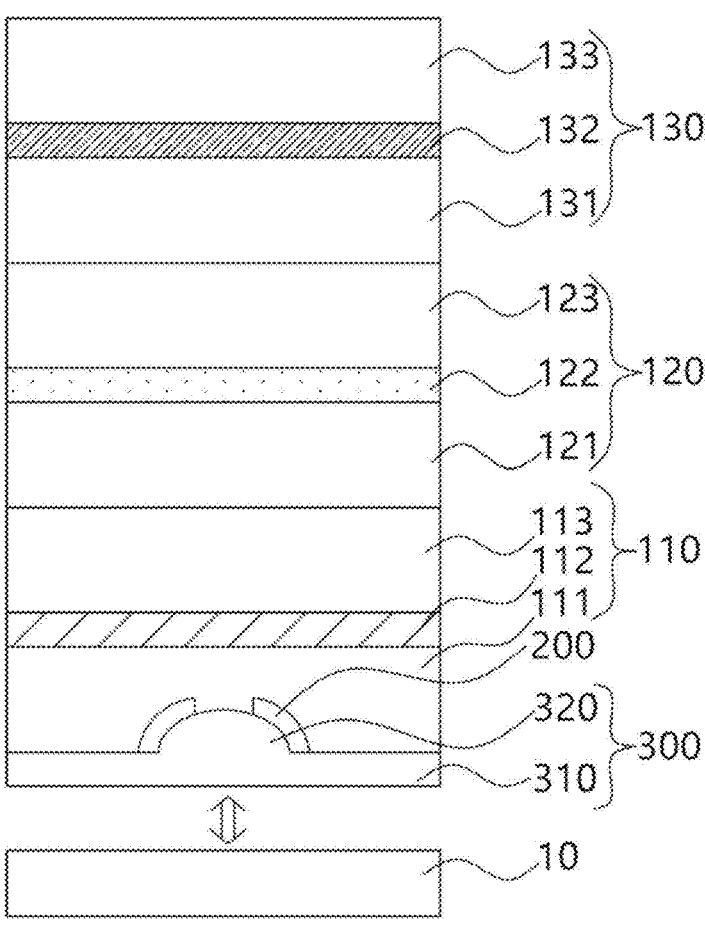

Referring to FIG. 10, a first active layer 112 and a first p-type semiconductor layer 113 are formed on the first n-type semiconductor layer 111, so that the first light emitting diode 110 is formed. The first light-emitting diode 110 preferably emits blue light.

Subsequently, the second-light emitting diode 120 is formed on the first light-emitting diode 110 through a continuous epitaxial growth process. When the first light-emitting diode 110 has the material and configuration for generating blue light, the second light-emitting diode 120 preferably forms green light. To generate green light, the second light-emitting diode 120 is composed of a GaN-based compound semiconductor, and a second p-type semiconductor layer 121, a second active layer 122, and a second n-type semiconductor layer 123 are formed on the first light emitting diode 110. In particular, it is preferable that the second active layer 122 has a multi-quantum-well structure, and the band gap of the well layer is lower than the band gap of the well layer of the first active layer 112.

In addition, the third light-emitting diode 130 is formed on the second light-emitting diode 120. When the third light emitting diode 130 is composed of a GaN-based compound semiconductors, the third light-emitting diode 130 may be formed by an epitaxial growth process based on the crystal structure of the second light-emitting diode 120, and may emit red light. When the third light-emitting diode 130 is formed on the second light-emitting diode 120 through the epitaxial growth process, the third light-emitting diode 130 preferably includes the third n-type semiconductor layer 131, the third active layer 132 and the third p-type semiconductor layer 133. In addition, the third light-emitting diode 130 may have a structure bonded to the second light emitting diode 120 according to a bonding process after being formed on a separate substrate. For example, the third light-emitting diode 130 may be formed on a GaAs substrate, and the third p-type semiconductor layer 133, the third active layer 132, and the third n-type semiconductor layer 131 are sequentially formed. In addition, these semiconductor layers and the active layer are preferably composed of an AlInGaP-based compound semiconductors. Thereafter, the third light-emitting diode 130 formed on GaAs is bonded to the second light-emitting diode 120, and the third light-emitting diode 130 is formed on the second light-emitting diode 120 by dissolving the GaAs base. The third light-emitting diode 130 preferably emits red light.

Also, separate semiconductor layers for blocking current may be interposed between the respective light-emitting diodes.

Next, the light extractor 300 and the substrate 10 are separated using laser lift-off. Through the separation, the structure of FIG. 3 is formed. In addition, although structures for electrodes are omitted in this embodiment, shapes and structures of the electrodes may be any type as long as the structures allows independently supplying current to each light-emitting diode. For example, the first n-type semiconductor layer 111, the first p-type semiconductor layer 113, the second p-type semiconductor layer 121, the second n-type semiconductor layer 123, the third p-type semiconductor layer 133 and the third n-type semiconductor layer 131 are opened through lateral etching, and individual electrodes may be formed through an electrode patterning and deposition processes. In addition, electrodes extending up to each semiconductor layers may be formed from the surface of the third p-type semiconductor layer 133 to form a vertical structure.

In addition, when the n-type semiconductor layer, the active layer, and the p-type semiconductor layer are successively formed using the surface of the protrusion 320 and the exposed bulk portion 310 in FIG. 10 as seeds for epitaxial growth, the unit pixel shown in FIG. 1 may be manufactured.

Figure 11:
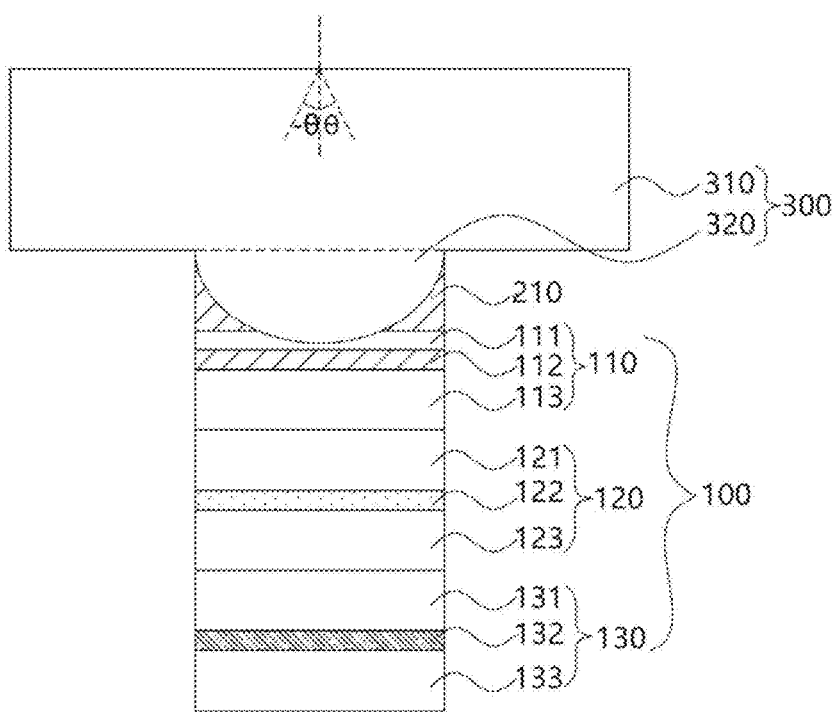
FIG. 11 is another cross-sectional view illustrating a pixel of a microdisplay according to a second embodiment of the present inventive concept.

FIG. 11 is another cross-sectional view illustrating a pixel of a microdisplay according to a second embodiment of the present inventive concept.

Referring to FIG. 11, a unit pixel of a microdisplay includes a light-emitting body 100, a concave reflector 210 with a center aperture formed in contact with the light-emitting body 100, and a light extractor 300.

The light-emitting body 100 has a structure in which three light-emitting diodes 110, 120 and 130 are vertically stacked just as shown in FIG. 3, and one light-emitting body 100 generates blue, green, and red light.

Also, the material and shape of the light extractor 300 are the same as those shown in FIG. 3. Accordingly, the light extractor 300 has an n-GaN material, and has a bulk portion 310 and a protrusion 320. Most of the surface of the bulk portion 310 is exposed, the central portion of the protrusion 320 is also open, and a concave reflector 210 with a center aperture is formed on the side surface of the protrusion 320. While the concave reflector 210 with a center aperture in FIG. 1 has a constant thickness, the concave reflector 210 with a center aperture in FIG. 11 is formed such that the space between the first n-type semiconductor layer 111 having a flat shape and the hemispherical protrusion 320 is filled. Accordingly, the inner surface of the concave reflector 210 with a center aperture is in contact with the protrusion 320, and the outer surface of the concave reflector 210 with a center aperture is in contact with the first n-type semiconductor layer 111. The interface between the first n-type semiconductor layer 111 and the outer surface of concave reflector 210 with a center aperture becomes a flat surface with almost no curvature.

Simulation Example 2

A unit pixel having almost the same configuration as that of Simulation Example 1 is used. However, as described in FIG. 11, a concave reflector with a center aperture made of $SiO_2$ is filled between the hemispherical protrusion and the planar first n-type semiconductor layer.

Figure 12:
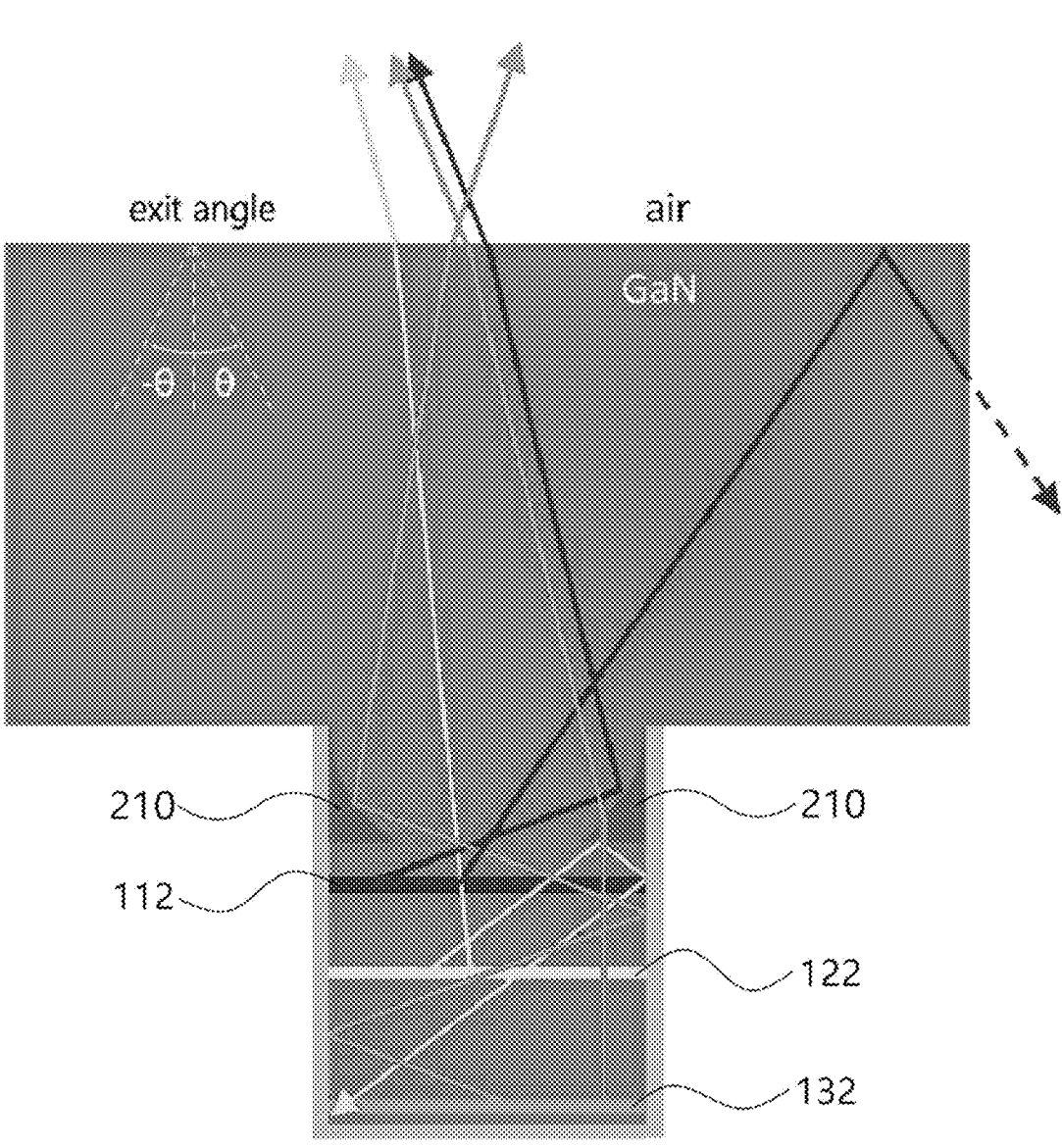
FIG. 12 is a simulation diagram illustrating a light extractor of the unit pixel of FIG. 11 according to Simulation Example 2 of the present inventive concept.

FIG. 12 is a simulation diagram illustrating a light extractor of the unit pixel of FIG. 11 according to Simulation Example 2 of the present inventive concept.

Referring to FIG. 12, when the light formed in the first active layer 112 to the third active layer 132 has a low exit angle θ or an exit angle θ that can pass through the opening of the concave reflector 210 with a center aperture, light exits to the outside through the light extractor. However, when a reflection occurs on the outer surface of the concave reflector with a center aperture due to the large exit angle θ, it is reflected by other layers or components, the reflected light passes through the opening of the concave reflector with a center aperture, and the passed light is also reflected on the inner surface of concave reflector with a center aperture, so that light has a low exit angle θ and exits to outside. Accordingly, the light exited through the light extractor has a small exit angle θ, and forms light in a direction perpendicular to the plane formed by the light source.

Furthermore, the intensity of light having an exit angle within the range of ±15° may be significantly increased compared to the intensity of light having different exit angles. That is, it is confirmed that the intensity of light having an exit angle within the range of ±15° is significantly increased compared to the intensity of light having an exit angle outside the range of ±15°. So, it is confirmed that at least two types of light on the hemispherical protrusion enters the light extractor with a small exit angle through the concave reflector with a center aperture and exits to the outside. In the present inventive concept described above, a hemispherical protrusion is formed in the light extractor, and a concave reflector with a center aperture is formed on the side surface of the protrusion. The concave reflector with a center aperture forms an opening in the central region. Light formed in the active layers of the light emitting diodes is reflected at the outer surface of the concave reflector with a center aperture, enters the light extractor through the opening, or is reflected at the inner surface of the concave reflector with a center aperture so that light of low exit angle exits to the outside. Accordingly, a much increased forward-going light occurs, and emission of light having a large exit angle can be minimized, so that it can be applied to different displays for varying purposes.

The invention claimed is:

1. A pixel of a microdisplay comprising:
   a light extractor having a compound semiconductor and having a hemispherical protrusion and a bulk portion having the same material as the protrusion;
   a reflector with a center aperture formed on a surface of the protrusion; and
   a light emitting body formed on the reflector with the center aperture and a single crystal grown from the light extractor to form light of a specific wavelength,
   wherein the hemispherical protrusion has a convex shape toward the light emitting body, the light of the specific wavelength formed at the light emitting body passes the center aperture and the light passing through the center aperture is directed toward the light extractor through reflections at the hemispherical inner surface of the reflector contacted with the hemispherical protrusion.

2. The pixel of a microdisplay of claim 1, wherein the light extractor is doped n-type, and the light-emitting body forms visible light or ultraviolet light.

3. The pixel of a microdisplay of claim 1, wherein the reflector with the center aperture has a concave shape toward the light extractor, and the central portion of the reflector with the center aperture is open.

4. The pixel of a microdisplay of claim 1, wherein the reflector with the center aperture has a uniform thickness.

5. The pixel of a microdisplay of claim 1, wherein the reflector with the center aperture has a non-uniform thickness and is formed to fill space between the protrusion and the light emitting body.

6. A pixel of a microdisplay comprising:
   a light extractor having a hemispherical protrusion made of a GaN material and a bulk portion having the same material as the protrusion;
   a reflector with a center aperture formed on a surface of the protrusion; and
   a light-emitting body formed on the reflector with the center aperture for forming light of a first wavelength and light of a second wavelength longer than the first wavelength, wherein the hemispherical protrusion has a convex shape toward the light emitting body, the lights of the first wavelength and the second wavelength formed at the light emitting body passes the enter aperture and the light passing through the center aperture is directed toward the light extractor through reflections at the hemispherical inner surface of the reflector contacted with the hemispherical protrusion.

7. The pixel of a microdisplay of claim 6, wherein the light extractor is doped n-type.

8. The pixel of a microdisplay of claim 6, wherein the reflector with the center aperture has a concave shape toward the light extractor, and the central portion of the reflector with the center aperture is open.

9. The pixel of a microdisplay of claim 8, wherein the reflector with a center aperture has $SiO_2$ or $Al_2O_3$.

10. The pixel of a microdisplay of claim 8, wherein the reflector with the center aperture has a uniform thickness.

11. The pixel of a microdisplay of claim 8, wherein the reflector with the center aperture has a refractive index that is larger than the refractive index of air and smaller than the refractive index of GaN.

12. The pixel of a microdisplay of claim 8, wherein the reflector with the center aperture has a non-uniform thickness and is formed to fill a space between the surface of the protrusion and the light-emitting body.

13. The pixel of a microdisplay of claim 6, wherein the light emitting body includes,
   a first light-emitting diode formed on the reflector with the center aperture, and generating the light of the first wavelength; and
   a second light-emitting diode formed on the first light emitting diode and generating the light of the second wavelength.

14. The pixel of a microdisplay of claim 13, wherein the light emitting body further includes a third light-emitting diode that is formed on the second light-emitting diode and generates light of a third wavelength that is longer than the second wavelength,
   wherein the light of the first wavelength is blue light, the light of the second wavelength is green light, and the light of the third wavelength is red light.

* * * * *